US010951248B1

(12) United States Patent
Kamgaing et al.

(10) Patent No.: US 10,951,248 B1
(45) Date of Patent: Mar. 16, 2021

(54) RADIO FREQUENCY (RF) MODULE WITH SHARED INDUCTOR

(71) Applicant: Intel Corporation, Santa Clara, CA (US)

(72) Inventors: Telesphor Kamgaing, Chandler, AZ (US); Feras Eid, Chandler, AZ (US); Georgios Dogiamis, Chandler, AZ (US); Aleksandar Aleksov, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/725,494

(22) Filed: Dec. 23, 2019

(51) Int. Cl.
*H04B 1/00* (2006.01)
*H04B 1/04* (2006.01)
*H03H 7/38* (2006.01)

(52) U.S. Cl.
CPC ........... *H04B 1/0075* (2013.01); *H03H 7/383* (2013.01); *H04B 1/0458* (2013.01); *H03H 2007/386* (2013.01)

(58) Field of Classification Search
None
See application file for complete search history.

(56) References Cited

U.S. PATENT DOCUMENTS

| 2004/0124826 | A1* | 7/2004 | Hazucha | H01F 29/02 |
| | | | | 323/355 |
| 2007/0241985 | A1* | 10/2007 | Suzuki | H01Q 1/50 |
| | | | | 343/860 |
| 2013/0250819 | A1* | 9/2013 | Khlat | H03H 7/465 |
| | | | | 370/278 |
| 2017/0093554 | A1* | 3/2017 | Ebihara | H04L 49/25 |
| 2018/0343000 | A1* | 11/2018 | Nosaka | H04B 1/48 |
| 2019/0013790 | A1* | 1/2019 | Ayranci | H03H 7/0161 |
| 2019/0097672 | A1* | 3/2019 | Nosaka | H03H 7/38 |
| 2019/0312608 | A1* | 10/2019 | Muto | H04B 1/0458 |
| 2019/0386631 | A1* | 12/2019 | Ueno | H03H 9/54 |
| 2020/0083865 | A1* | 3/2020 | Mori | H03H 7/38 |
| 2020/0204201 | A1* | 6/2020 | Mori | H04B 1/0057 |

\* cited by examiner

*Primary Examiner* — Lana N Le

(74) *Attorney, Agent, or Firm* — Patent Capital Group

(57) ABSTRACT

Embodiments may relate to a radio frequency (RF) front-end module (FEM) with a first filter and a second filter. The RF FEM may include a termination inductor coupled to ground, and a switch that is to selectively couple the first filter and the second filter to the termination inductor. Other embodiments may be described or claimed.

10 Claims, 9 Drawing Sheets

RADIO FREQUENCY (RF) MODULE WITH SHARED INDUCTOR

BACKGROUND

The next generation of mobile and wireless communication devices may require a significant increase in the number of radio frequency (RF) bands used to support increasing data demands. The increased RF bands may be supported by a number of filters used to support the different RF bands. However, the filters may occupy a significant area of the RF front-end module (FEM).

DETAILED DESCRIPTION

Figure 1:
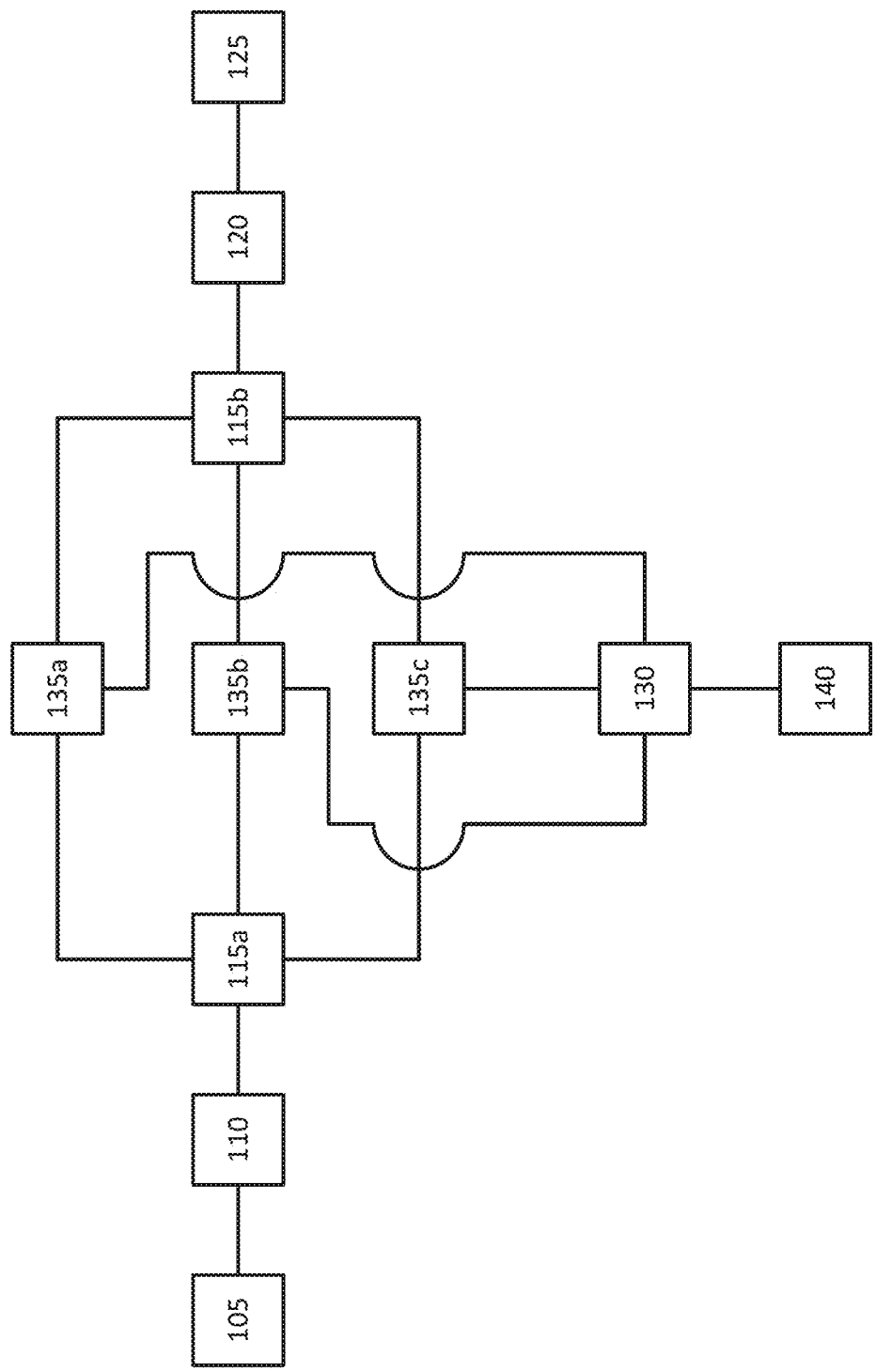
FIG. 1 depicts an example simplified diagram of an RF FEM with shared inductors, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted, RF FEMs may use a number of filters to support different RF bands. The filters may occupy a significant area of the RF FEM. For example, in legacy RF FEMs, bulk acoustic wave (BAW) resonators and filters may be used for operation in mid and high RF bands. In these legacy RF FEMs, a separate filter may be used for each band, and several of the filters may be coupled with or include an inductor. Each of the filters may be sealed individually and assembled to the package substrate. However, this structure may result in a high number of filters and, particularly, a high number of inductors. The filters and inductors may require a large amount of space and result in a significant increase in the RF FEM form factor.

As a specific example, a legacy transmit RF FEM may include one or more power amplifiers (PAs), a band-select switch, a logic circuit, and a matching network as well as several filters. Many of those filters may be acoustic wave resonator (AWR) filters (e.g., BAW, surface acoustic wave (SAW), contour-mode resonator (CMR) or some other type of AWR) that are designed to pass signals in specific RF bands (e.g., a long-term evolution (LTE) band or some other band). A driver or logic die may be used to control the band selection, and switches may be used to enable signal flow between the transceiver, filter, and antenna. Each of the filters may be designed to operate at a specific frequency and may be assembled to a package substrate, printed circuit board (PCB), etc.

More generally, in a typical RF FEM transmission path, the signal may go from the modem/transceiver to the antenna by passing through a PA to a first band-select switch. The band-select switch may route the signal to a signal path related to a specific frequency band. The band-specific signal path may include a bandpass filter which may include an AWR, one or more inductors, and one or more passive elements such as capacitors, resonators, etc. The signal may then go to a second band-select switch (which is coupled to each of the RF-specific signal paths) and to an antenna tuner or an antenna.

In the bandpass filter, inductors may be used for matching or for termination. A matching inductor may be placed in series with a shunt resonator, and interact with it to create transmission zeros at frequencies where co-existence may be desired. For emerging 5G and multiband radios, it may be desirable to have an increased number of termination inductors to generate additional transmission zeros. However, as noted, inductors-on-substrate may utilize a large amount of real-estate of the RF FEM, and hence any increase in the number of inductors may increase the filter and RF FEM sizes.

By contrast, embodiments herein may relate to reducing the form factor of the RF FEM by sharing common components (e.g., inductors) between the RF bands that do not have to operate simultaneously. Sharing the inductors may provide a number of advantages. For example, the reuse of RF inductors may reduce the overall form factor of the RF FEM. This form factor reduction may lead to both performance improvement and cost reduction. Shared inductors may also provide the flexibility of increasing the filter stages for better co-existence of different RF bands, particularly with respect to fifth generation (5G) bands. Additionally, embodiments with shared inductors may be combined with lithographically-defined or thickness-defined resonators.

FIG. 1 depicts an example simplified diagram of an RF FEM with shared inductors, in accordance with various embodiments. This example may be specifically depicted or described with respect to the transmit path, however it will be understood that the example described herein could be modified to be equally applicable to a receive path of an RF FEM.

The RF FEM may include an input 105. The input may be, for example, a logic, a transmit driver, or some other signal or data generating component of the RF FEM or an electronic device of which the RF FEM is a part. In general, the input 105 may be to generate or provide a data signal that is to be transmitted by an antenna of the RF FEM.

The RF FEM may further include a matching network 110. The matching network 110 may be designed to match the impedance of system providing the signal at the input 105 to the impedance of circuitry of the RF FEM (e.g., the filters). The matching network 110 may include a number of components such as inductors, capacitors, resistors, etc. Details of the matching network may be described in further detail with respect to FIG. 3.

The RF FEM may further include a switch 115a which may selectively direct the signal to a plurality of filters 135a, 135b, and 135c (collectively, "filters 135"). As noted above, each of the filters 135 may be configured to support a different RF band than another of the filters 135. However, it will be noted that in some embodiments the specific RF bands supported by one of the filters 135 may at least partially, or fully, overlap with the RF band of another of the filters. It will also be understood that although only three filters 135 are depicted in FIG. 1, in some embodiments the RF FEM may include more or fewer filters than depicted. The specific number of filters may be based on considerations such as design requirements, the components used, the use case to which the RF FEM will be put, etc.

Generally, the filters 135 may be configured to selectively pass or filter certain frequencies from the data signal as it propagates through the filter. In some embodiments, the filters 135 may be referred to as "having" a specific bandwidth or frequency. In other embodiments, the filters 135 may be referred to as "being related to" the bandwidth or frequency.

The RF FEM may then include a switch 115b at the output of the filters 135. The switch 115b may be coupled with each of the filters 135 and configured to receive the signal from the filters 135 and direct the signal to a matching network 120 that is positioned between the switch 115b and an output 125 of the RF FEM. The matching network 120 may be similar to matching network 110. Specifically, the matching network 120 may be configured to match the output impedance of the switch an 115b to the input impedance of the system receiving the signal from the output 125 of the RF FEM. The output 125 of the RF FEM may be, for example, an antenna, an output logic or driver, an impedance tuner, or some other element. More generally, the output 125 may be configured to wirelessly transmit the data signal from the RF FEM.

The RF FEM may further include a switch 130 that is coupled with each of the filters 135. The switch 130 may couple the filters 135 to a termination 140. The termination 140 may include one or more termination inductors, as will be described in greater detail with respect to FIG. 3.

As may be seen, the embodiment of FIG. 1 may provide a number of advantages. Specifically, through the placement and use of switches 115a and 115b, the matching networks 110 and 120 may be coupled with each of the filters 135. Therefore, a separate matching network 110 or 120 may not be required for each of the filters 135, which may enable a reduction in the form factor of the RF FEM.

Additionally, through the use of switch 130, each of the filters 135 may be coupled with the termination 140, which may include one or more inductors. Therefore, the termination 140 may be reused, and a separate inductor may not be required for each of the filters 135.

Figure 2:
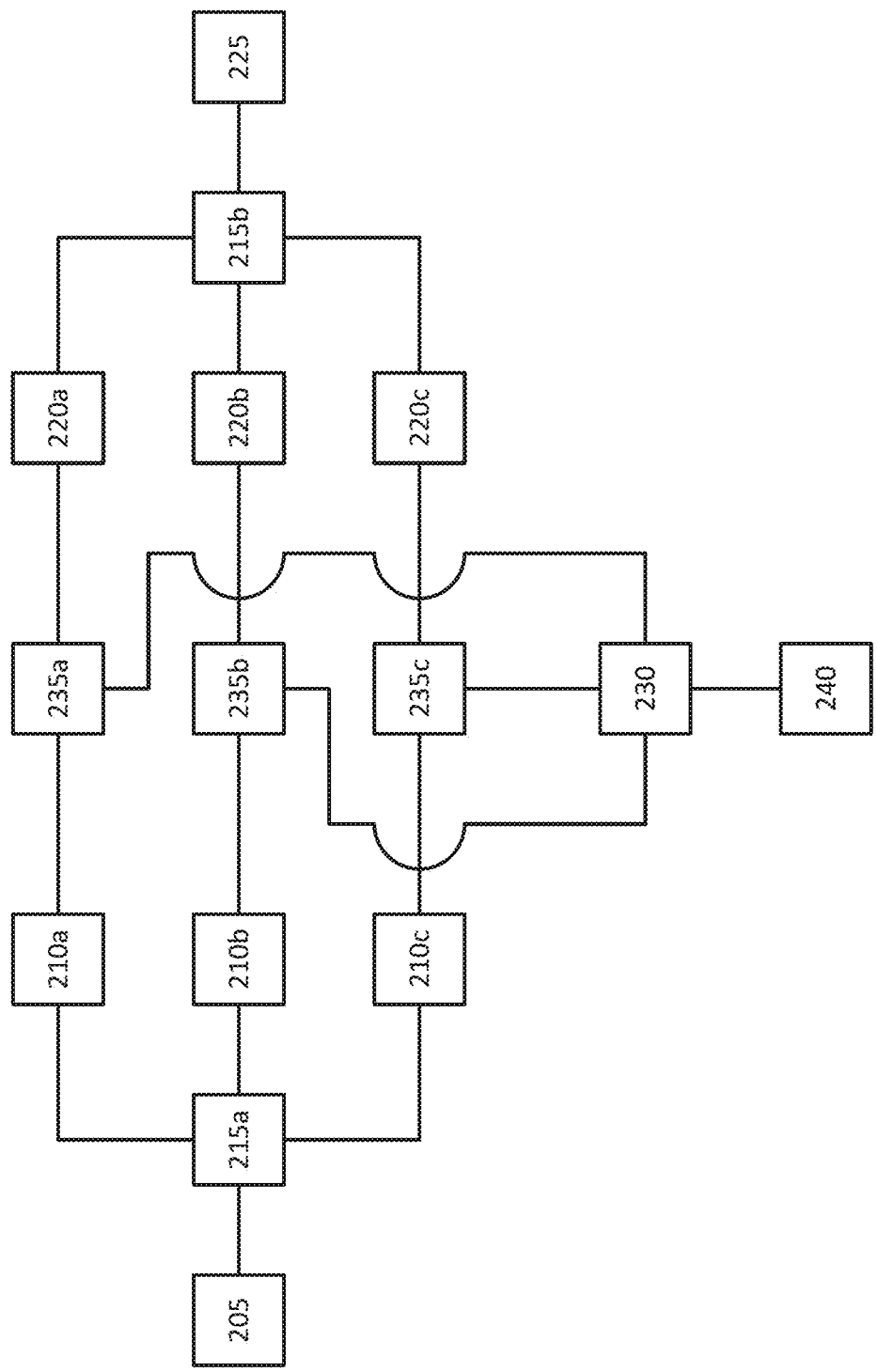
FIG. 2 depicts an alternative simplified diagram of an RF FEM with shared inductors, in accordance with various embodiments.

In some embodiments, it may not be desirable to have a single matching network for the plurality of filters. For example, one of the filters may have a different impedance than another of the filters, and so a single impedance matching circuit may not be appropriate. FIG. 2 depicts an example of a network that may include a plurality of matching networks for the plurality of filters. Specifically, FIG. 2 depicts an alternative simplified diagram of an RF FEM with shared inductors, in accordance with various embodiments.

The RF FEM may include an input 205, a switch 215a, filters 235a/235b/235c (collectively, "filters 235"), switch 215b, output 225, switch 230, and termination 240 which may be respectively similar to, and share one or more characteristics with, input 105, switch 115a, filters 135a/135b/135c, switch 115b, output 125, switch 130, and termination 140.

The RF FEM may further include a plurality of matching networks. Specifically, matching networks 210a, 210b, and 210c (collectively "matching networks 210") may be at the input of the filters 235, and may be respectively similar to, and share one or more characteristics with, matching network 110. Similarly, matching networks 220a, 220b, and 220c (collectively "matching networks 220") may be at the output of the filters 235, and may be respectively similar to, and share one or more characteristics with, matching network 120. As may be seen in FIG. 2, the switch 215a may be, in terms of the signal flow from the input 205 to the output 225, prior to the matching networks 210. Similarly, the switch 215b may be, in terms of the signal flow from the input 205 to the output 225, subsequent to the matching networks 220.

It will be understood that FIGS. 1 and 2 are intended as examples of a network in an RF FEM, and other embodiments may vary from those depicted. For example, in some embodiments two or more filters may share a single matching network, while another filter may have a dedicated matching network. In some embodiments, filters may share a matching network at the input while having a dedicated matching network at the output (or vice-versa). Other variations may be present in other embodiments.

Figure 3:
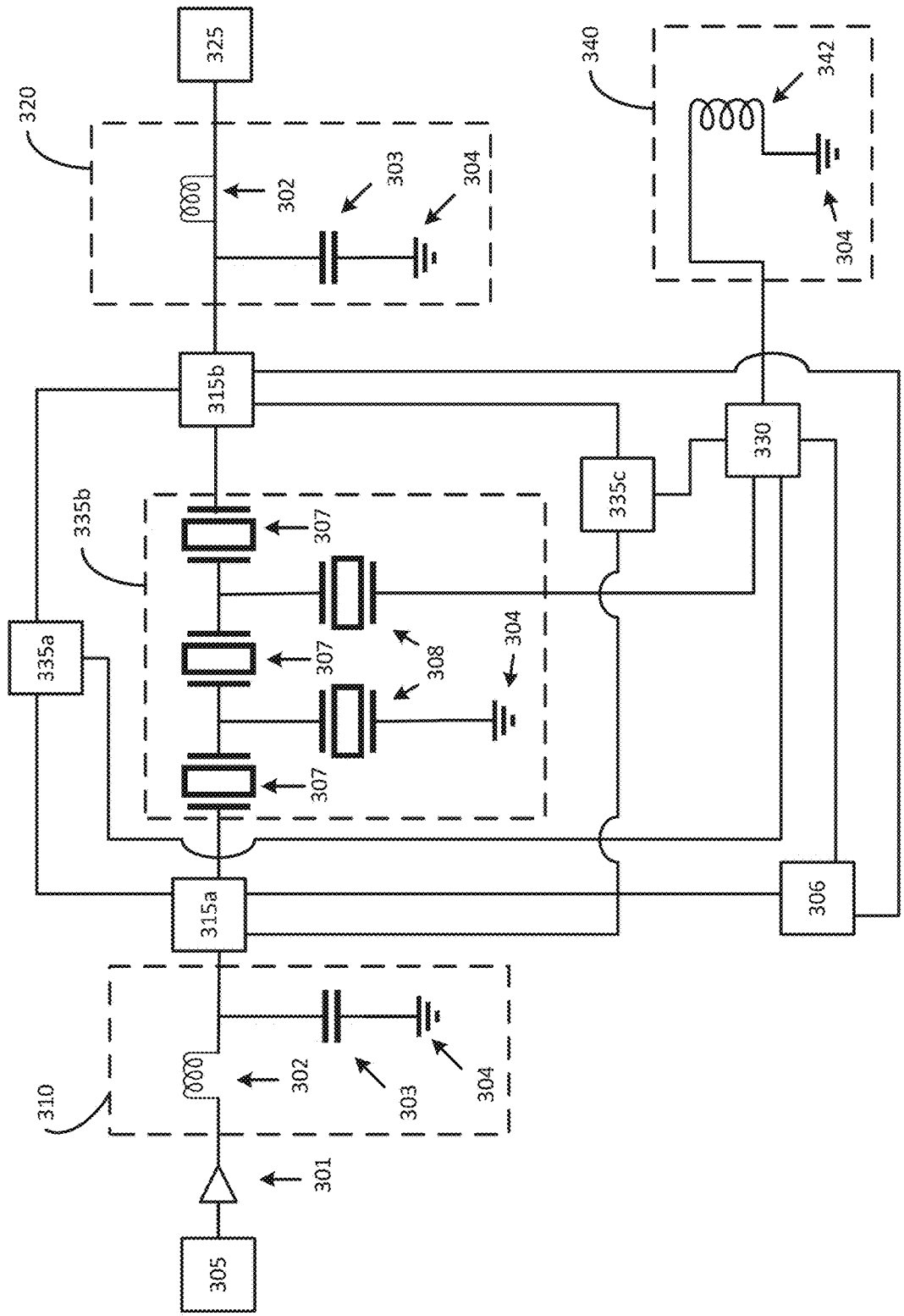
FIG. 3 depicts a more detailed diagram of a circuit path in an RF FEM with shared inductors, in accordance with various embodiments.

FIG. 3 depicts a more detailed diagram of a circuit path in an RF FEM with shared inductors, in accordance with various embodiments. It will be noted that the circuit path of FIG. 3 is generally analogous to that of FIG. 1 wherein the matching networks are shared (e.g., prior to the switch coupled to the input of the filter, and subsequent to the switch coupled to the output of the filter). However, it will be understood that a real-world implementation of the circuit of FIG. 3 may be similar to the circuit path of FIG. 2 or some other circuit path as discussed above.

The circuit path may include an input 305, an output 325, a switch 315, a switch 315b, and a switch 330, which may be respectively similar to, and share one or more characteristics with, input 105, output 125, switch 115a, switch 115b, and switch 130. The circuit path may further include a matching network 310 that is communicatively between the input 305 and the switch 315a. In some embodiments, the circuit path may include an amplifier 301 (which may be, e.g., a PA) positioned between the input 305 and the matching network 310. The matching network may be generally similar to matching network 110. More specifically, the matching network 310 may include a matching inductor 302. The matching inductor 302 may match the impedance of the amplifier 301 to an impedance of a filter of the RF FEM as described above. The matching network 310 may further include a connection to ground 304 and a capacitor 303 that is placed between the main signal path and the ground 304.

The circuit path may include an additional matching network 320, which may be generally similar to matching network 120. The matching network 320 may include a matching inductor 302, a capacitor 303, and a ground 304. The matching inductor 302 of the matching network 320 may be configured to match an impedance of the filter to an impedance of the output 325 as described above.

The RF FEM may further include a number of filters 335a, 335b, and 335c (collectively "filters 335"), which may be respectively similar to, and share one or more characteristics with, filters 135a, 135b, and 135c. Details of the structure are depicted with respect to filter 335b. It will be understood that others of the filters 335a and 335c may include similar structural characteristics, which are not depicted in FIG. 3 for the sake of clarity and lack of clutter of the Figure.

Specifically, the filter 335b may include a number of resonators 307 that are in series with one another. As noted above, the resonators 307 may be BAW resonators or may be some other type of resonator such as a thin-film bulk acoustic resonator ("FBAR" or "TFBAR"), a SAW resonator, an AWR, or some other type of resonator. The filter 335b may additionally include a number of shunt resonators 308. The shunt resonators 308 may be similar to (e.g., the same type as) one or more of resonators 307. In other embodiments, one or more of the resonators 307 or shunt resonators 308 may vary from another of the resonators 307 or shunt resonators 308. In some embodiments, one or more of the shunt resonators 308 may be coupled with ground 304. In another embodiment, one or more of the shunt resonators 308 may be coupled with switch 330 as depicted.

The RF FEM may further include a termination 340, which may be generally similar to, and share one or more characteristics with, termination 140. The termination may include a termination inductor 342 and ground 304.

The RF FEM may further include a switching logic 306 which may be coupled with one or more of the switches 315a, 315b, or 330. The switching logic 306 may be, for example, a circuit, a processor, a processor core, or some other piece of hardware, firmware, software, etc. Generally, the switching logic 306 may be configured to facilitate switching of the various switches 315a, 315b, or 330. For example, the switching logic 306 may identify that it is desirable for the signal to be routed through filter 335a, and so configure switch 315a accordingly. Similarly, if the signal is routed through filter 335a, then the switching logic 306 may configure switch 330 such that a resonator of filter 335a is coupled with termination 340. In some cases, the switching logic 306 may further configure switch 315b such that filter 335a is coupled with matching network 320. It will be understood, however, that this is just an example of the coupling of, and actions of, switching logic 306. In some embodiments, a separate switching logic may be present for one or more of switches 315a, 315b, or 330. In some embodiments, switch 315b may not be present, and so the switching logic 306 may not be coupled with, or controlling, switch 315b. Other variations may be present in other embodiments.

As may be seen, the RF FEM of FIG. 3 may include a number of advantages. Primarily, in legacy RF FEMs, one or more of the shunt resonators 308 may have required a termination 340 for each of the filters 335. Additionally, in legacy RF FEMs, each of the filters may have required a separate matching network 310. As such, a legacy RF FEM may have required up to nine inductors for the three depicted filters of FIG. 3 (one for each of the six matching networks and one for each of the terminations). However, in the embodiment of FIG. 3, the nine inductors may be significantly reduced to three inductors, which may significantly reduce the form factor of the resultant RF FEM as described above.

It will be understood that the above-depicted elements of FIG. 3 are intended as example, and other embodiments may vary. For example, certain of the structures such as the matching networks 310/320, the filter 335b, or the termination 340 may have more or fewer circuit elements than depicted in the Figure. For example, the matching networks 310/320 may have more or fewer elements such as resistors, additional capacitors, etc., or the capacitor 303 may not be present. Similarly, the filter 335*b* may have more or fewer resonators 307, shunt resonators 308, ground connections 304, etc., or may include additional elements such as capacitors, resistors, etc. The termination 340 may likewise include additional elements such as resistors, capacitors, etc. Finally, as previously noted, in some embodiments the RF FM may include more or fewer filters than the three filters that are depicted. Other embodiments may include additional or alternative variations.

Figure 4:
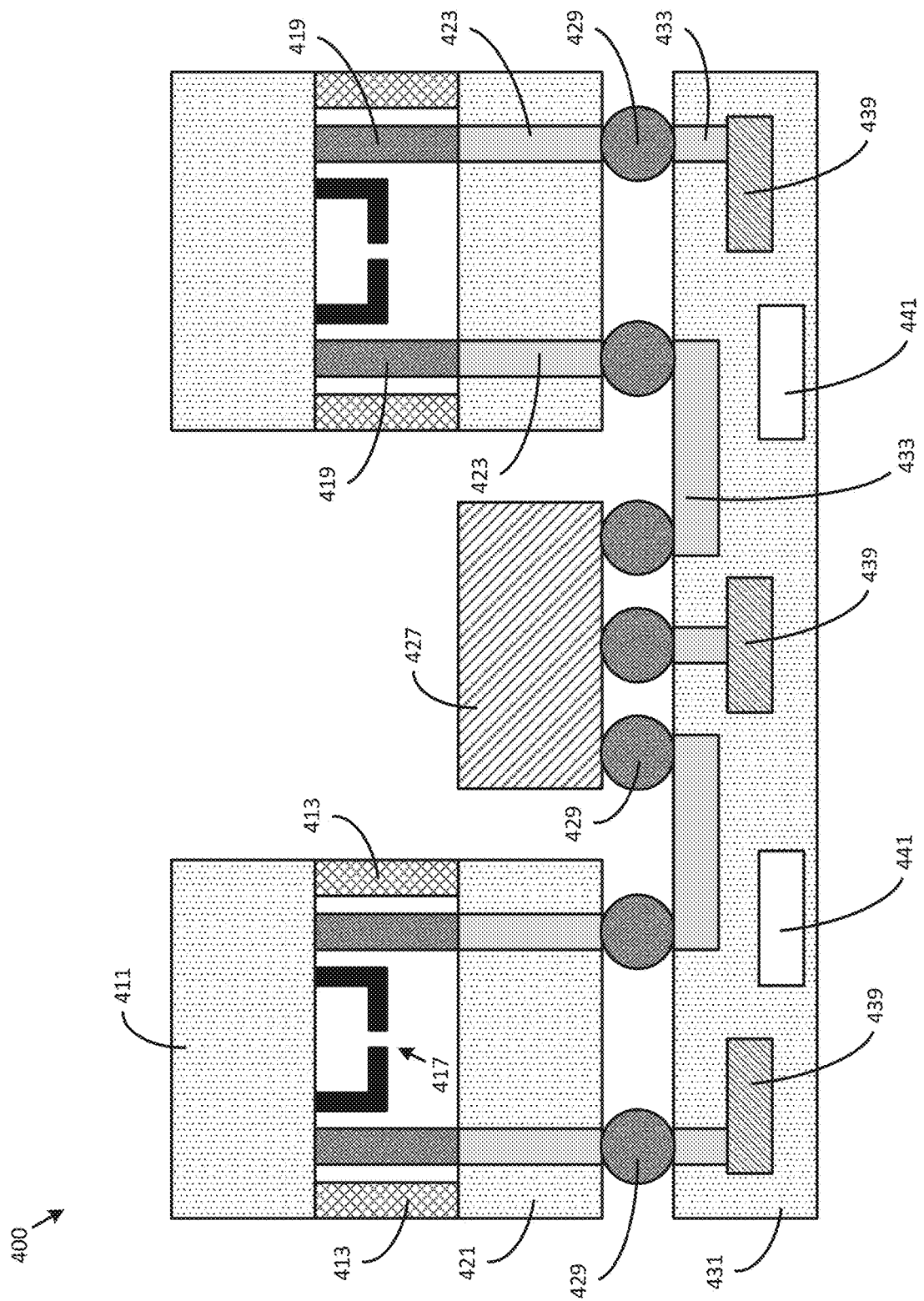
FIG. 4 depicts an example structure of an RF FEM with shared inductors, in accordance with various embodiments.

FIG. 4 shows an example implementation of an RF FEM 400 wherein the resonators are integrated on individual dies. Specifically, FIG. 4 depicts an example structure of an RF FEM with shared inductors, in accordance with various embodiments. It will be understood that in FIG. 4, and other Figures herein, each and every element of the Figure may not be labeled for the sake of clarity of the Figure. However, elements that share characteristics in terms of shading, structure, placement, etc. may be assumed to be similar to one another with respect to the description or discussion of that element. For example, only a first resonator die 411 may be labeled in FIG. 4, however it may be seen that the RF FEM 400 may include two such resonator dies.

In the RF FEM 400, a second die that combines with a metal ring to provide hermetic sealing to each resonator die may be used as a lid. Matching network and termination inductors are integrated on a package substrate as either discrete elements, embedded elements, or a combination thereof. The switch die may be or include both band-select and inductor-select switches. When a typical band is operating, the associated band-select switches may be closed, and the various antenna switches from a through path between the resonators and inductors may provide the desired transmission zeros or rejection. It will be noted that in various embodiments, specific inductors, or values thereof, may be selected to achieve a substantial inductor count reduction while also increasing the number of stages per filter.

In FIG. 4, the RF FEM 400 may include a number of resonator dies 411. Each of the resonator dies 411 may include one or more resonators 417. The resonators 417 may be a shunt resonator similar to shunt resonator 308, or a series resonator similar to resonator 307. Generally, the resonators 417 may be a SAW, a BAW, an AWR, a TFBAR, an FBAR, etc. as described above.

The resonator dies 411 may be coupled with a lid 421. The lid 421 may be formed of a material such as silicon, ceramic, an organic material with a metal or silicon nitride surface finish, etc. Specifically, the resonator dies 411 may be coupled with the lid in a number of ways. One such way may be by interconnects 419. The interconnects 419 may be considered to be depicted in FIG. 4 as pillars, but in other embodiments the interconnects 419 may be some other type of conductive interconnect such as a pin, a solder bump, etc. Generally, the interconnects 419 may allow for signal communication between the resonator die 411 and the lid 421.

The resonator die 411 and the lid 421 may further be coupled by a seal ring 413. The seal ring 413 may be formed of a material such as copper, solder, Gold or some other material. The seal ring 413 may serve a variety of functions. One such function may be to hermetically seal the cavity between the resonator die 411 and the lid 421 in which the resonator 417 is placed. As used herein, "hermetically sealing" a cavity may refer to sealing the cavity with respect to one or more of temperature, humidity, electromagnetic signals, air pressure, or some other environmental condition. By hermetically sealing the cavity, the operation of the resonator 417 may be maintained at a specific level or within a specific parameter, for example with respect to a particular RF frequency band. Additionally, the seal ring 413 may provide structural support for the coupling of the resonator die 411 and the lid 421.

The lid 421 may include a number of conductive elements such as vias, microstrips, striplines, pads, traces, etc. Two such of the conductive elements 423 are depicted as vias. Particularly, the conductive elements 423 may be referred to as through-substrate vias (TSVs) that traverse the height of the lid. More particularly, the lid 421 may be coupled with a substrate 431 by interconnects 429, as will be described in greater detail below, and the conductive elements 423 may allow for communication through the lid between the resonator die 411 and the substrate 431.

The interconnects 429 are depicted in FIG. 4 as solder bumps, which may be, for example, elements of a solder grid array (SGA) or a ball grid array (BGA). In other embodiments the interconnects 429 may be a different type of interconnect such as a pin of a pin grid array (PGA) or some other type of interconnect.

The substrate 431 may be, for example, considered to be a cored or coreless substrate. The substrate 431 may include one or more layers of a dielectric material which may be organic or inorganic. The package substrate 431 may further include one or more conductive 433 elements such as vias, pads, traces, microstrips, striplines, etc. The conductive elements 433 may be internal to, or on the surface of, the substrate. Generally, the conductive elements 433 may be formed of a material such as copper, gold, etc., and may allow for the routing of signals through the substrate 431, or between elements that are coupled to the substrate 431. In some embodiments the substrate 431 may be, for example, a PCB, an interposer, a motherboard, or some other type of substrate.

The substrate 431 may further include various elements such as passive elements 441 or inductors 439. The passive elements 441 may be, for example, resistors, capacitors, etc. In some embodiments, the passive elements 441 may be replaced by, or complimented by, active elements such as logic, memory, or some other circuit. In some embodiments, the passive elements 441 may be coupled with one or more of the inductors 439 or the conductive elements 433 by additional conductive elements, which may be in or out of the plane of the cross-sectional view of FIG. 4.

It will be understood that the exact signal pathway and operation of the RF FEM 400 may not be readily apparent from the simplified diagram of FIG. 4. For example, in some embodiments one or more of the inductors 439 may be a matching inductor (e.g., matching inductor 302), a termination inductor (e.g., termination inductor 342), or, in some embodiments, both if various switches of the RF FEM are configured to allow for such a signal pathway. Similarly, as noted, the switch 427 may be a band-select switch (e.g., switches 315*a* or 315*b*), an inductor-select switch (e.g., switch 330), or both. Other variations may be present in other embodiments.

Additionally, it will be understood that the RF FEM 400 of FIG. 4 is intended as a highly simplified embodiment, and various additional elements such as additional active or passive elements, various conductive elements, etc. may not be depicted in FIG. 4. For example, one or more of the resonator dies 411, the lids 421, the switch 427, the substrate 431, etc. may have additional or alternative elements than those shown in FIG. 4, or elements arranged in an alternative configuration. Similarly, the RF FEM 400 may include additional elements that are not shown such as a signal input, a signal output, an antenna, etc. In some embodiments, the specific dimensions of various elements, e.g., the height/width/length of various of the elements, the diameter of the interconnects, the specific shape of a given element, etc. may be different in different embodiments. Particularly, the relative sizes or shapes of elements as compared to one another may be different in different embodiments.

Figure 5:
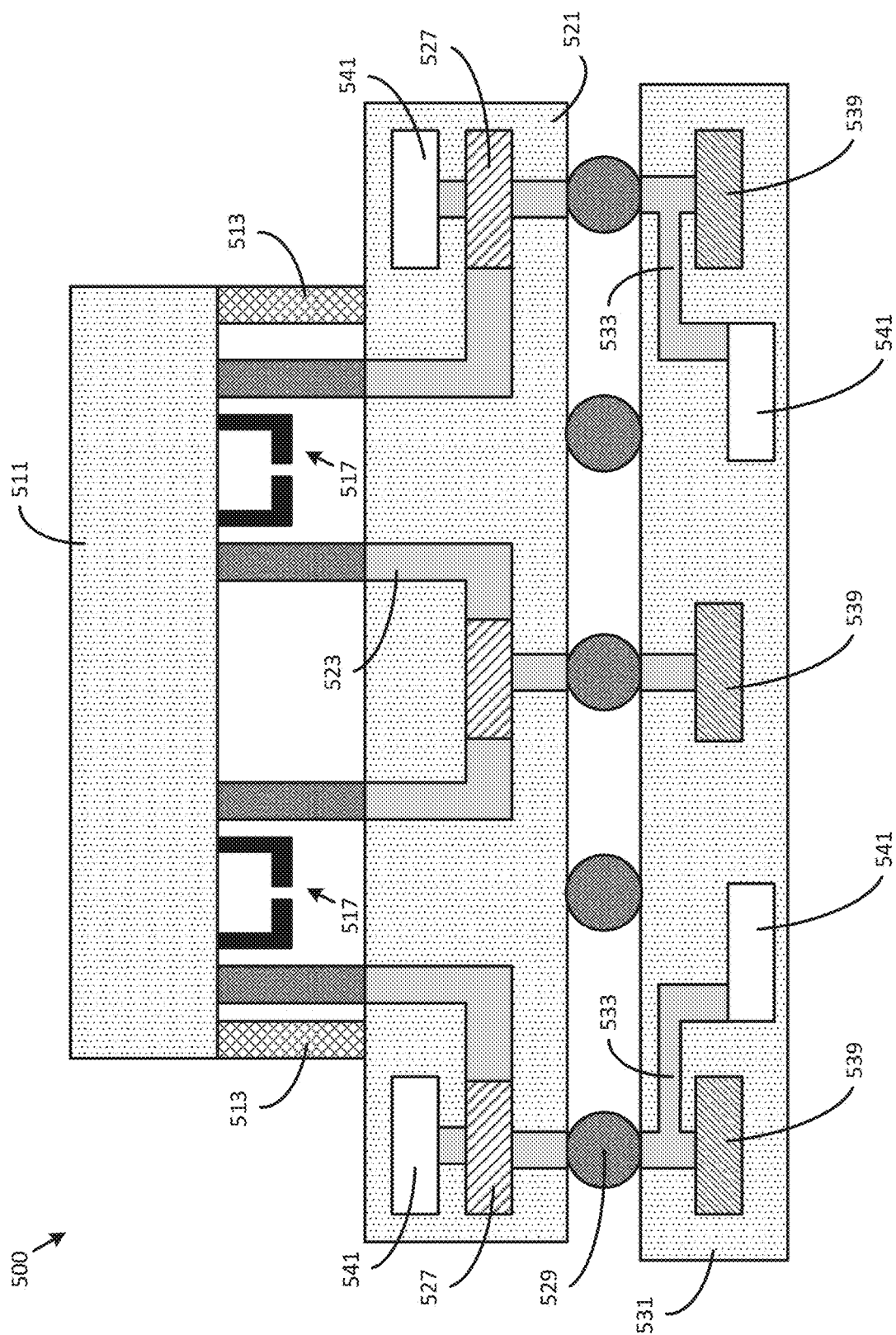
FIG. 5 depicts an alternative example structure of an RF FEM with shared inductors, in accordance with various embodiments.

FIG. 5 depicts an alternative example structure of an RF FEM 500 with shared inductors, in accordance with various embodiments. Particularly, FIG. 5 depicts an embodiment wherein the resonator die may include a plurality of resonators, and wherein the switch may be integrated into the lid rather than coupled with the substrate as a separate die.

Generally, the RF FEM 500 may be similar to, and share one or more characteristics with, RF FEM 400. For example, the RF FEM 500 may include a resonator die 511 with resonators 517, which may be similar to, and share one or more characteristics with, resonator die 411 and resonators 417. The RF FEM 500 may further include a lid 521 which may be similar to, and share one or more characteristics with, lid 421. The resonator die 511 may be coupled with the lid 521 by a plurality of interconnects and a seal ring 513, which may be similar to, and share one or more characteristics with, seal ring 413. As may be seen, the RF FEM 500 may include a resonator die 511 with a plurality of resonators 517, rather than a plurality of resonator dies each with a single resonator such as resonator dies 411 and resonator 417. In this embodiment, the seal ring 513 may surround the cavity between the resonator die 511 and the lid 521, and hermetically seal the cavity with both resonators 517 positioned therein. It will be understood, however, that this configuration is an example of one embodiment and other embodiments may include a plurality of seal rings, each sealing a single resonator of a resonator die with a plurality of resonators.

The lid 521 may be coupled, by way of interconnects 529, with a substrate 531 that includes passive elements 541, conductive elements 533, and inductors 539. The interconnects 529, substrate 531, inductors 539, conductive elements 533, and passive elements 541 may be respectively similar to, and share one or more characteristics with, interconnects 429, substrate 431, inductors 439, conductive elements 433, and passive elements 441. As can be seen in FIG. 4, in some embodiments one or more of the inductors 539 may be communicatively coupled with a passive element 541 by a conductive element 533. In some embodiments, this coupling may be a shared signal path between the inductor 539, the passive element 541, and an interconnect 529 as depicted in FIG. 4. In other embodiments, the coupling of the passive element 541 and the inductor 539 may be separate from the signal path between the inductor 539 and the interconnect 529.

As may be seen, the lid 521 may also include a number of conductive elements 523 and passive elements 541. The conductive elements 523 may be similar to, and share one or more characteristics with, conductive elements 423. The lid 521 may additionally include one or more switches 527, which may be similar to, and share one or more characteristics with, switch 427. The switches 527 may be integrated into (i.e., be an element of) the lid 521 rather than a stand-alone die such as switch 427. It will be understood that although the switches 527 are shown as fully integrated into the lid 521, in some embodiments a switch 527 may be at a surface of the lid 521, coupled to the lid 521, at least partially protruding from the lid 521, etc. The specific configuration of elements in FIG. 5 (or other Figures herein) may be based on specific use cases, materials used, design considerations, other elements integrated into the RF FEM 500, etc.

Figure 6:
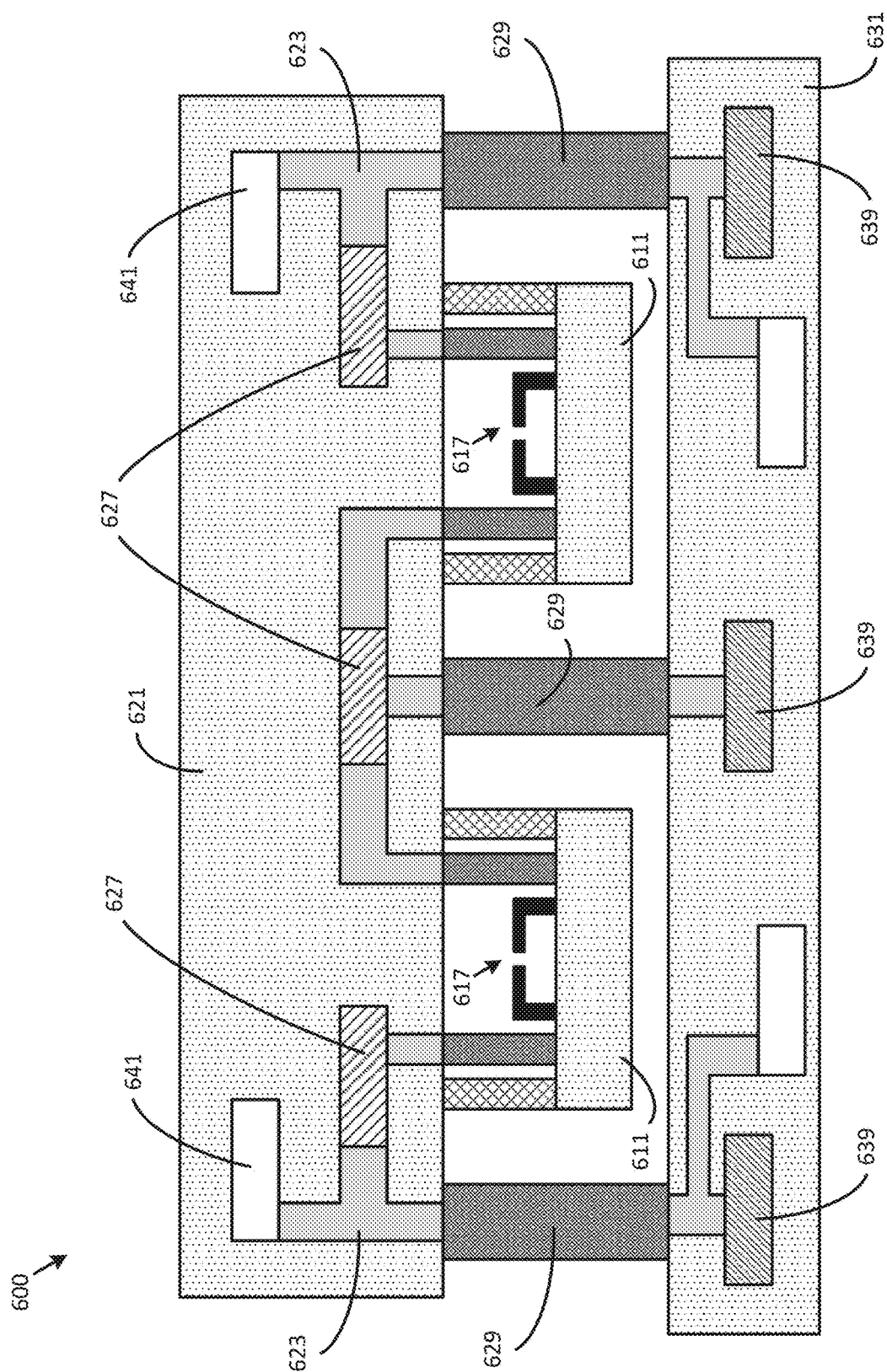
FIG. 6 depicts an alternative example structure of an RF FEM with shared inductors, in accordance with various embodiments.

FIG. 6 depicts an alternative example structure of an RF FEM 600 with shared inductors, in accordance with various embodiments. In the embodiment of FIG. 6, the resonator dies 611 may be located between the lid 621 and the substrate 631, and the conductive elements 623 of the lid 621 may not extend through the entirety of the lid 621.

Specifically, the RF FEM 600 may be generally similar to, and share one or more characteristics with RF FEM 400. For example, the RF FEM 600 may include a lid 621 with conductive elements 623, switches 627, and passive elements 641, which may be respectively similar to, and share one or more characteristics with, lid 421, conductive elements 423, switches 427, and passive elements 441. The RF FEM 600 may also include resonator dies 611 with resonators 617, which may be respectively similar to, and share one or more characteristics with, resonator dies 411 and resonators 417. The RF FEM 600 may further include a substrate 631 with inductors 639, which may be respectively similar to, and share one or more characteristics with, substrate 431 and inductors 439.

The RF FEM 600 may further include interconnects 629. Interconnects 629 may be generally similar to, and share one or more characteristics with, interconnects 429. However, as may be seen in FIG. 4, it may be desirable for the interconnects 629 to have a larger z-height to accommodate for the positioning of the resonator die 611 between the lid 621 and the substrate 631. Therefore, as depicted in FIG. 6, it may desirable for the interconnect 629 to be a pillar-type interconnect (e.g., a conductive element that is coupled to a pad of the substrate 631 and a pad of the lid 621). In other embodiments, the interconnect 629 may be a solder bump or solder ball, or some other type of interconnect as previously described.

As noted with respect to FIG. 4, it will be understood that the embodiments of FIGS. 5 and 6 are intended as example embodiments, and other embodiments may vary in one or more respects. For example, an RF FEM may include elements of one or more of the Figures—e.g., a resonator die with multiple resonators positioned between the lid and a substrate, the existence of both a resonator die with a single resonator and a resonator die with a plurality of resonators, etc. Additionally, the size/shape/positioning/configuration of various elements may be different in different embodiments. Other variations may be present.

Figure 7:
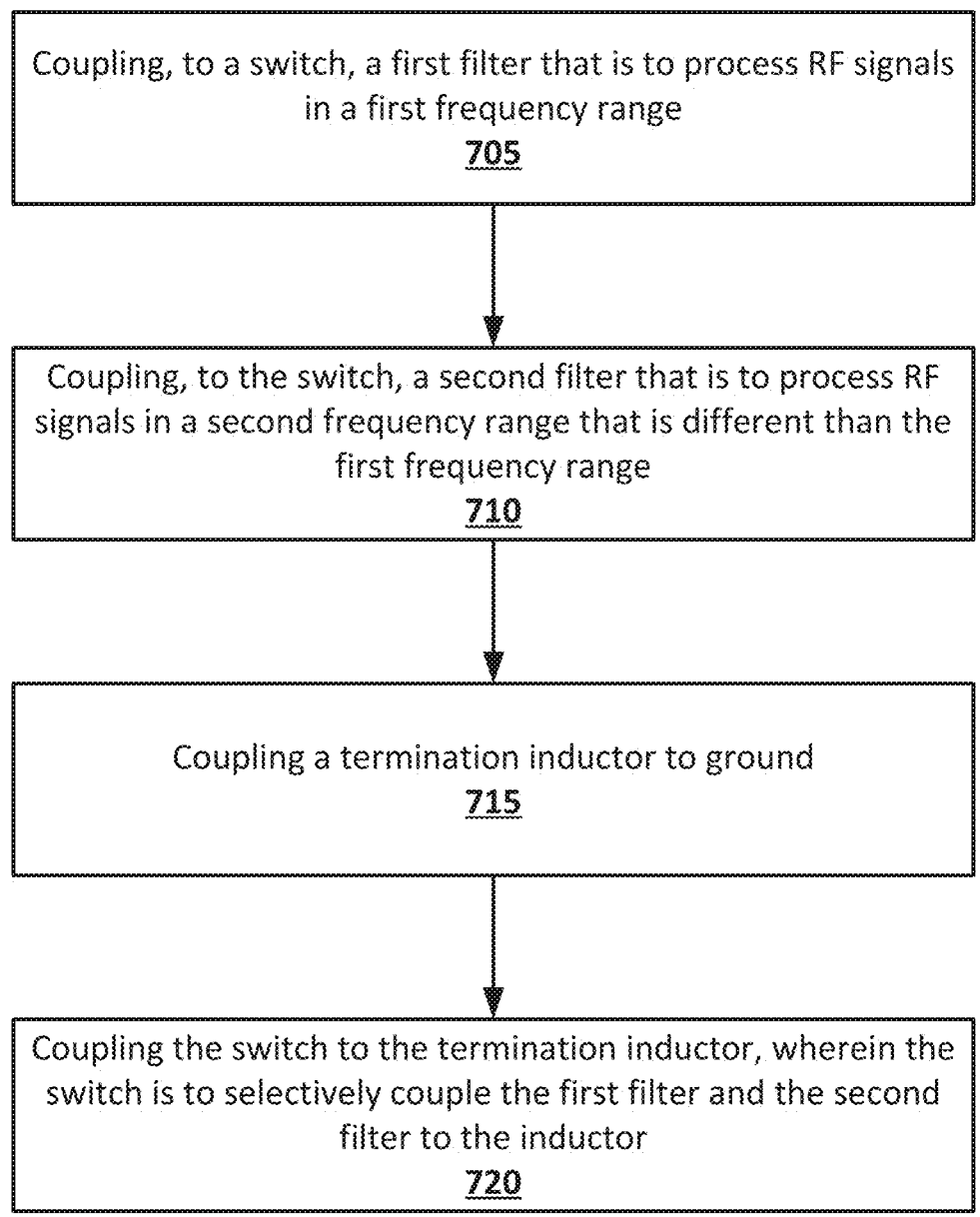
FIG. 7 depicts an example technique for the manufacture of an RF FEM with shared inductors, in accordance with various embodiments.

FIG. 7 depicts an example technique for the manufacture of an RF FEM with shared inductors, in accordance with various embodiments. The technique may be described with respect to elements of FIG. 3, however it will be understood that the technique may be applicable to other embodiments, in whole or in part, with or without modification.

The technique may include coupling, at 705, to a switch, a first filter that is to process RF signals in a first frequency range. The filter may be similar to, for example, filter 335*b* or some other filter of FIG. 3. The switch may be similar to, for example, switch 330.

The technique may further include coupling, at 710, to the switch, a second filter that is to process RF signals in a second frequency range that is different than the first frequency range. The second filter may be, for example, another of filters 335 of FIG. 3.

The technique may further include coupling, at 715, a termination inductor to ground. The termination inductor may be similar to, for example, termination inductor 342 of termination 340. The ground may be similar to, for example, ground 304 of the termination 340.

The technique may further include coupling, at 720, the switch to the termination inductor. Such a coupling could be as depicted in, for example, FIG. 3. Specifically, the switch may selectively couple the first filter and the second filter to the inductor as described with respect to other embodiments.

It will be understood that this example technique is intended as a highly simplified example, and other embodiments may have more or fewer elements than depicted. In some embodiments, elements may be performed in a different order than depicted, or concurrently with one another.

Figure 8:
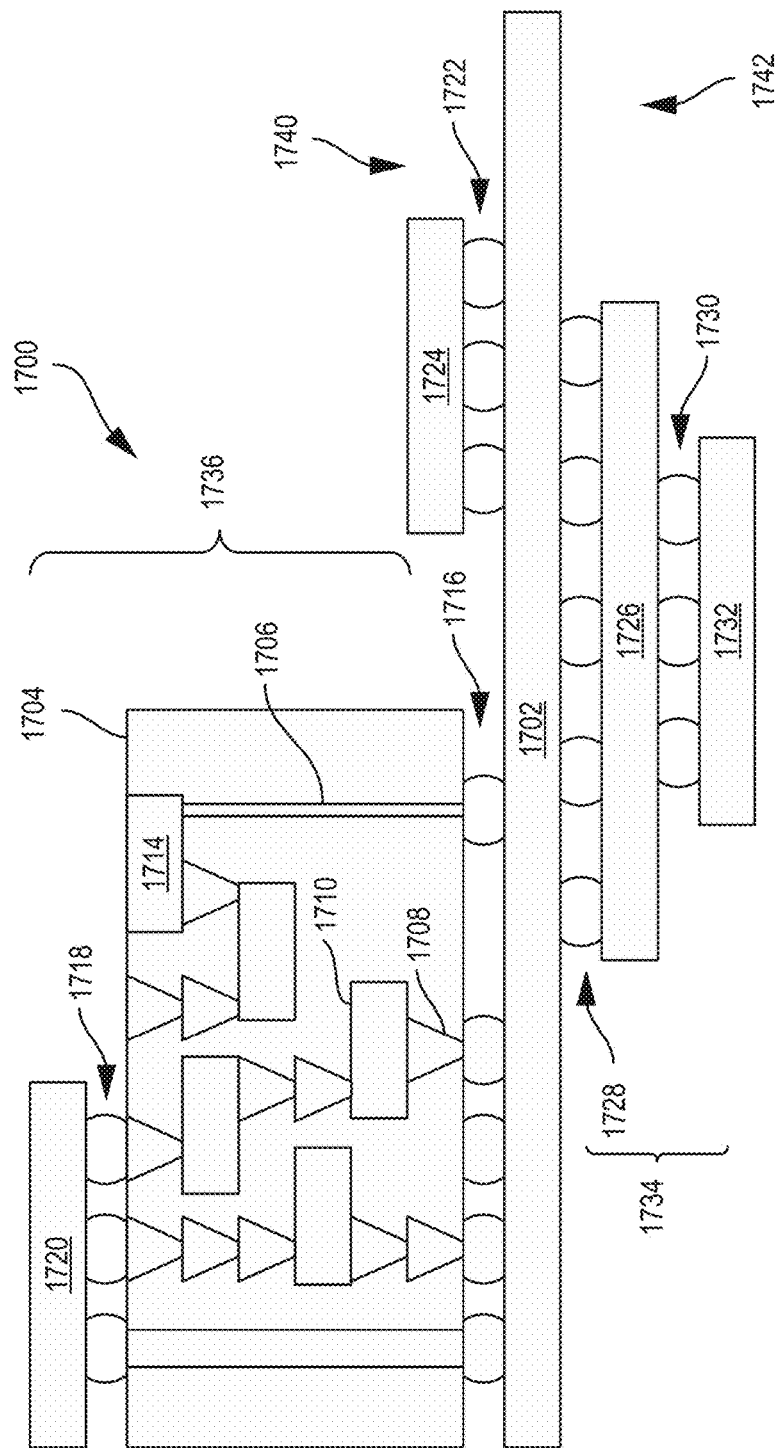
FIG. 8 is a side, cross-sectional view of an integrated circuit (IC) device assembly that may include, be including in, or be related to an RF FEM with shared inductors, in accordance with various embodiments.

FIG. 8 is a side, cross-sectional view of an IC device assembly 1700 that may include one or more IC packages or other electronic components (e.g., a die) that include, are included in, or are otherwise related to a RF FEM with shared inductors, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 8 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 8), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 8, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 8, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may be, include, by included in, or be otherwise related to a RF FEM with one or more shared inductors.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 8 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 9:
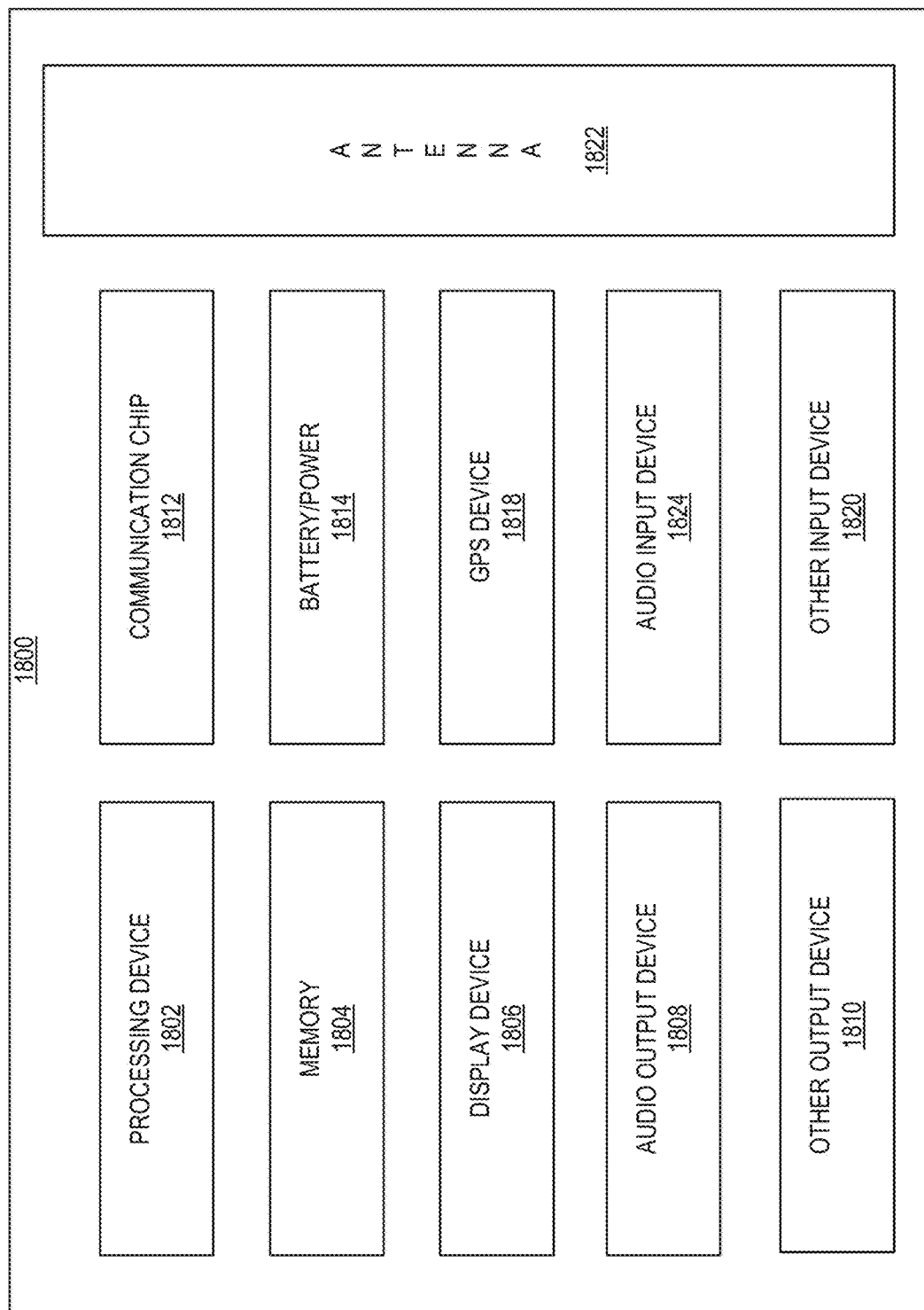
FIG. 9 is a block diagram of an example electrical device that may include an RF FEM with shared inductors, in accordance with various embodiments.

FIG. 9 is a block diagram of an example electrical device 1800 that may include one or more RF FEMs with shared inductors, in accordance with any of the embodiments disclosed herein. For example, any suitable ones of the components of the electrical device 1800 may include one or more of the IC device assemblies 1700, IC packages, IC devices, or dies disclosed herein. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a RF FEM comprising: a first filter that is to process RF signals in a first frequency range; a second filter that is to process RF signals in a second frequency range; a termination inductor coupled to ground; and a switch that is to selectively couple the first filter and the second filter to the termination inductor.

Example 2 includes the RF FEM of example 1, wherein the first filter is to filter RF signals in the first frequency range.

Example 3 includes the RF FEM of example 1, wherein the RF FEM further includes a logic circuit communicatively coupled with the switch, wherein the logic circuit is to cause the switch to couple the first filter or the second filter to the termination inductor.

Example 4 includes the RF FEM of example 1, wherein the first filter includes: a first plurality of resonators in series between a signal input and a signal output of the first filter; and a shunt resonator in a ground path of the first filter, wherein the shunt resonator is communicatively positioned between a resonator of the first plurality of resonators and the switch.

Example 5 includes the RF FEM of any of examples 1-4, wherein the RF FEM includes a matching network coupled with the first filter.

Example 6 includes the RF FEM of example 5, wherein the matching network is communicatively coupled with the first filter by a second switch that is operable to selectively couple the matching network to the second filter.

Example 7 includes the RF FEM of any of examples 1-4, further comprising a third filter that is to process RF signals in a third frequency range, and wherein the switch is further to selectively couple the third filter to the termination inductor.

Example 8 includes a RF FEM comprising: a substrate with an inductor; a resonator die with a resonator; a lid coupled with the resonator die, wherein the resonator is between the lid and the resonator die; and a switch that is communicatively coupled with the inductor and the resonator, and wherein the switch is to selectively couple the inductor and the resonator.

Example 9 includes the RF FEM of example 8, wherein the switch is a die that is coupled with the substrate.

Example 10 includes the RF FEM of example 8, wherein the switch is an element of the lid.

Example 11 includes the RF FEM of any of examples 8-10, wherein the resonator is a first resonator; wherein the resonator die includes a second resonator that is communicatively coupled with the switch; and wherein the switch is to selectively couple the inductor and the second resonator.

Example 12 includes the RF FEM of any of examples 8-10, wherein the resonator die is a first resonator die; wherein the RF FEM further comprises a second resonator die with a second resonator; and wherein the switch is to selectively couple the inductor and the second resonator.

Example 13 includes the RF FEM of any of examples 8-10, wherein the lid is between the substrate and the resonator die.

Example 14 includes the RF FEM of any of examples 8-10, wherein the resonator die is between the lid and the substrate.

Example 15 includes a method of forming a RF FEM, the method comprising: coupling, to a switch, a first filter that is to process RF signals in a first frequency range; coupling, to the switch, a second filter that is to process RF signals in a second frequency range that is different than the first frequency range; coupling a termination inductor to ground; and coupling the switch to the termination inductor, wherein the switch is to selectively couple the first filter and the second filter to the ground.

Example 16 includes the method of example 15, wherein coupling the second filter to the switch includes coupling a resonator die to a substrate.

Example 17 includes the method of example 16, wherein coupling the second filter to the switch further includes coupling a switch die to the substrate.

Example 18 includes the method of any of examples 15-17, further comprising coupling, to the switch, a third filter that is to process RF signals in a third frequency range that is different than the first and second frequency ranges.

Example 19 includes the method of any of examples 15-17, further comprising coupling, to the first filter and the second filter, a second switch; and coupling, to the second switch, a matching network.

Example 20 includes the method of example 19, wherein the second switch is to selectively couple the matching network with the first filter and the second filter.

Example 21 includes an electronic device comprising: an antenna to transmit a wireless signal; and a RF FEM that is communicatively coupled with antenna, wherein the RF FEM includes a switch that is to selectively couple a first filter and a second filter with a termination inductor.

Example 22 includes the electronic device of example 21, wherein the first filter is to process signals at a first RF band, and the second filter is to process signals at a second RF band that is different than the first RF band.

Example 23 includes the electronic device of example 21, wherein the switch is a die that is coupled with a substrate of the RF FEM.

Example 24 includes the electronic device of example 21, wherein the switch is an element of a lid that is coupled with a resonator die of the first filter.

Example 25 includes the electronic device of example 24, wherein the lid is to hermetically seal a cavity between the lid and the resonator die, and wherein the cavity includes a resonator of the resonator die.

Example 26 includes the electronic device of any of examples 21-25, wherein the first filter includes: a first plurality of resonators in series between an input matching network and an output matching network of the first filter; and a shunt resonator in a ground path of the first filter, wherein the shunt resonator is communicatively positioned between a resonator of the first plurality of resonators and the switch.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A radio frequency (RF) front-end module (FEM) comprising:
   a first filter that is to process RF signals in a first frequency range;
   a first plurality of resonators in series between an input matching network and an output matching network of the first filter;
   a second filter that is to process RF signals in a second frequency range;
   a termination inductor coupled to ground;
   a switch that is to selectively couple the first filter and the second filter to the termination inductor; and
   a shunt resonator in a ground path of the first filter, wherein the shunt resonator is communicatively positioned between a resonator of the first plurality of resonators and the switch.

2. The RF FEM of claim 1, wherein the first filter is to filter RF signals in the first frequency range.

3. The RF FEM of claim 1, wherein the RF FEM further includes a logic circuit communicatively coupled with the switch, wherein the logic circuit is to cause the switch to couple the first filter or the second filter to the termination inductor.

4. The RF FEM of claim 1, wherein the matching network is communicatively coupled with the first filter by a second switch that is operable to selectively couple the matching network to the second filter.

5. The RF FEM of claim 1, further comprising a third filter that is to process RF signals in a third frequency range, and wherein the switch is further to selectively couple the third filter to the termination inductor.

6. An electronic device comprising:
   an antenna to transmit a wireless signal;
   a radio frequency (RF) front-end module (FEM) that is communicatively coupled with antenna, wherein the RF FEM includes a switch that is to selectively couple a first filter and a second filter with a termination inductor;
   a first plurality of resonators in series between an input matching network and an output matching network of the first filter; and
   a shunt resonator in a ground path of the first filter, wherein the shunt resonator is communicatively positioned between a resonator of the first plurality of resonators and the switch.

7. The electronic device of claim 6, wherein the first filter is to process signals at a first RF band, and the second filter is to process signals at a second RF band that is different than the first RF band.

8. The electronic device of claim 6, wherein the switch is a die that is coupled with a substrate of the RF FEM.

9. The electronic device of claim 6, wherein the switch is an element of a lid that is coupled with a resonator die of the first filter.

10. The electronic device of claim 9, wherein the lid is to hermetically seal a cavity between the lid and the resonator die, and wherein the cavity includes a resonator of the resonator die.

* * * * *